(12) United States Patent
Extrand (10) Patent No.: US 6,852,390 B2
(45) Date of Patent: Feb. 8, 2005

(54) ULTRAPHOBIC SURFACE FOR HIGH PRESSURE LIQUIDS

(75) Inventor: Charles W. Extrand, Minneapolis, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/454,745

(22) Filed: Jun. 3, 2003

(65) Prior Publication Data

US 2004/0208791 A1 Oct. 21, 2004

Related U.S. Application Data (60) Provisional application No. 60/462,963, filed on Apr. 15, 2003.

(51) Int. Cl.[7] .............................. B32B 3/00; B27N 3/08; C25D 17/00
(52) U.S. Cl. ........................ 428/156; 428/116; 428/118; 428/120; 428/409; 428/913; 264/239; 204/192.13; 216/84; 156/242; 101/483; 430/323; 430/325
(58) Field of Search ................................. 428/116, 118, 428/120, 156, 409, 913; 264/239, 298; 204/192.18, 472; 216/84; 156/153, 209, 242; 148/500; 101/348, 483; 430/323, 322, 325

(56) References Cited

U.S. PATENT DOCUMENTS

| 5,252,835 A | 10/1993 | Lieber et al. |
| 5,609,907 A | 3/1997 | Natan |

(List continued on next page.)

FOREIGN PATENT DOCUMENTS

| WO | WO 00/38845 | 7/2000 |
| WO | WO 00/39368 | 7/2000 |
| WO | WO 01/79142 A1 | 10/2001 |
| WO | WO 01/92179 A1 | 12/2001 |
| WO | WO 01/94034 A1 | 12/2001 |
| WO | WO 02/084340 A1 | 10/2002 |

OTHER PUBLICATIONS

Didem Öner et al., *Ultrahydrophobic Surfaces. Effects of Topography Length Scales on Wettability*, Langmuir 2000, Jun. 23, 2000, vol. 16, No. 20, pp. 7777–7782.

(List continued on next page.)

*Primary Examiner*—Donald J. Loney
(74) *Attorney, Agent, or Firm*—Patterson, Thuente, Skaar & Christensen, P.A.

(57) ABSTRACT

A durable ultraphobic surface that is capable of retaining ultraphobic properties at liquid pressures of one atmosphere and above. The surface generally includes a substrate portion with a multiplicity of projecting regularly shaped microscale or nanoscale asperities disposed so that the surface has a predetermined contact line density measured in meters of contact line per square meter of surface area equal to or greater than a contact line density value "$\Lambda_L$" determined according to the formula:

$$\Lambda_L = \frac{-10{,}330}{\gamma\cos(\theta_{a,0} + \omega - 90°)}$$

where $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

19 Claims, 7 Drawing Sheets

U.S. PATENT DOCUMENTS

| | | | |
|---|---|---|---|
| 5,679,460 | A | 10/1997 | Schakenraad et al. |
| 5,725,788 | A | 3/1998 | Maracas et al. |
| 5,900,160 | A | 5/1999 | Whitesides et al. |
| 6,312,303 | B1 | 11/2001 | Yaniv et al. |
| 6,352,758 | B1 * | 3/2002 | Huang et al. ............... 428/143 |
| 6,403,388 | B1 | 6/2002 | Birdsley et al. |
| 6,423,372 | B1 | 7/2002 | Genzer et al. |
| 6,432,866 | B1 | 8/2002 | Tennent et al. |
| 6,444,254 | B1 | 9/2002 | Chilkoti et al. |
| 6,455,021 | B1 | 9/2002 | Saito |
| 6,518,168 | B1 | 2/2003 | Clem et al. |
| 6,530,554 | B2 | 3/2003 | Shimmo et al. |
| 6,541,389 | B1 | 4/2003 | Kubo et al. |
| 6,652,669 | B1 * | 11/2003 | Reihs et al. ............... 148/241 |
| 2002/0025374 | A1 | 2/2002 | Lee et al. |
| 2002/0034879 | A1 | 3/2002 | Yun et al. |
| 2002/0114949 | A1 | 8/2002 | Bower et al. |
| 2002/0122765 | A1 | 9/2002 | Horiuchi et al. |
| 2002/0136683 | A1 | 9/2002 | Smalley et al. |
| 2002/0150684 | A1 | 10/2002 | Jayatissa |
| 2003/0047822 | A1 | 3/2003 | Hori et al. |

OTHER PUBLICATIONS

Robert H. Dettre et al., *Contact Angle Hysteresis II. Contact Angle Measurements on Rough Surfaces*, Advances in Chemistry Series, Mar. 22, 1963, pp. 136–144.

A.B.D. Cassie et al., *Wettability of Porous Surfaces*, Jun. 19, 1944, pp. 546–551.

C. Rascón et al., *Geometry–dominated fluid adsorption on sculpted solid substrates*, Nature, Oct. 26, 2000, vol. 407, pp. 986–989.

R. G. Cox, *The spreading of a liquid on a rough surface*, J. Fluid Mech., 1983, vol. 131, pp. 1–26.

G. Mchale et al., *Analysis of Shape Distortions in Sessile Drops*, Langmuir, 2001, vol. 17, pp. 6995–6998.

A. Esztermann et al., *Triple–Point Wetting on Rough Substrates*, The American Physical Society, Feb. 4, 2002, vol. 88, No. 5, pp. 55702/1–55702/4.

S.G. Mason, *Wetting and Spreading—Some Effects of Surface Roughness*, Academic Press, 1978, pp. 321–326.

H. Kamusewitz et al., *The relation between Young's equilibrium contact angle and the hysteresis on rough paraffin was surfaces*, Elsevier Science B.V., 1999, pp. 271–279.

J.F. Oliver et al., *Liquid spreading on rough metal surfaces*, Journal of Materials Science, 1980, vol. 15, pp. 431–437.

James E. Smay et al., *Colloidal Inks for Directed Assembly of 3–D Periodic Structures*, Langmuir, 2002, vol. 18, pp. 5429–5437.

Darron E. Hill et al., *Functionalization of Carbon Nanotubes with Polystyrene*, Macromolecules, 2002, vol. 35, pp. 9466–9471.

Robert J. Good, *A Thermodynamic Derivation of Wenzel's Modification of Young's Equation for Contact Angles; Together with a Theory of Hysteresis* Journal of American Chemical Society, Oct. 20, 1952, vol. 74, pp. 5041–5042.

Erdal Bayramli et al., *Tensiometric studies on wetting. I. Some effects of surface roughness (theoretical)*, Canadian Journal of Chemistry, 1981, vol. 59, pp. 1954–1961.

S. Semal et al., *Influence of Surface Roughness on Wetting Dynamics*, Langmuir, 1999, vol. 15, pp. 8765–8770.

J.F. Oliver et al., *The Apparent Contact Angle of Liquids on Finely–Grooved Solid Surfaces–A SEM Study*, Gordon and Breach Science Publishers Ltd., 1977, vol. 8, pp. 223–234.

A.J.G. Allan et al., *Wettability of Perfluorocarbon Polymer Films: Effect of Roughness*, Journal of Polymer Science, 1959, vol. XXXIX, pp. 1–8.

J.B. Sweeney et al., *Equilibrium Thin Films on Rough Surfaces. 1. Capillary and Disjoining Effects*, Langmuir, 1993, vol. 9, pp. 1551–1555.

Wei Chen et al., *Ultrahydrophobic and Ultralyophobic Surfaces: Some Comments and Examples*, Langmuir, 1999, vol. 15, pp. 3395–3399.

Jeffrey P. Youngblood et al., *Ultrahydrophobic Polymer Surfaces Prepared by Simultaneous Ablation of Polypropylene and Sputtering of Poly(tetrafluoroethylene) Using Radio Frequency Plasma*, Macromolecules, 1999, vol. 32, pp. 6800–6806.

Joanna Aizenberg et al., *Direct Fabrication of Large Micropatterned Single Cyrstals*, Science, vol. 299, Feb. 21, 2003, pp. 1205–1208.

J.D. Eick et al., *Thermodynamics of Contact Angles*, Journal of Colloid and Interface Science, Nov. 1975, vol. 53, No. 2, pp. 235–248.

F.Y.H. Lin et al., *Effect of Surface Roughness on the Dependence of Contact Angles on Drop Size*, Journal of Colloid and Interface Science, 1993, vol. 159, pp. 86–59.

Peter S. Swain et al., *Contact Angles on Heterogeneous Surfaces: A New Look at Cassie's and Wenzel's Laws*, Langmuir, 1998, vol. 14, pp. 6772–6780.

Kiyoharu Tadanaga et al., *Formation Process of Super–Water–Repellent $Al_2O_3$ Coating Films with High Transparency by the Sol–Gel Method*, Communications of the American Ceramic Society, 1997, vol. 80, No. 12, pp. 3213–3216.

Kiyoharu Tadanaga et al., *Super–Water–Repellent $Al_2O_3$ Coating Films with High Transparency*, Communications of the American Ceramic Society, 1997, vol. 80, No. 4, pp. 1040–1042.

Shuhong Li et al., *Super–Hydrophobicity of Large–Area Honeycomb–Like Aligned Carbon Nanotubes*, Journal of Physical Chemistry, 2002, vol. 106, No. 36, pp. 9274–9276.

J. Kijlstra et al., *Roughness and topology of ultra–hydrophobic surfaces*, Elsevier Science B.V., 2002, vol. 206, pp. 521–529.

Masahide Taniguchi et al., *Effect of Undulations on Surface Energy. A Quantitive Assessment*, Langmuir, 2001, vol. 17, pp. 4312–4315.

David Quéré, *Surface Chemistry Fakir droplets*, News & Views, 2002, pp. 14–15.

Mashahide Taniguchi et al., *Correcting for Surface Roughness: Advancing and Receding Contact Angles*, Langmuir, 2002, vol. 18, pp. 6465–6467.

M. Thieme et al., *Generation of Ultrahydrophobic Properties of Aluminuim—A First Step to Self–cleaning Transparently Coated Metal Surfaces*, Advanced Engin. Mater., Internet, 2001, vol. 9, pp. 1.

Zen Yoshimitsu et al., *Effects of Surface Structure on the Hydrophobicity and Sliding Behavior of Water Droplets*, Langmuir, 2002, vol. 18, 5818–5822.

David S. Soane et al., *Fluorsight*, Brennan Research Group, Jan. 2003, p. 15.

J.J. Bikerman, *Sliding of Drops From Surfaces of Different Roughness*, pp. 349–359.

A.B.D. Cassie, *Contact Angles*, Wool Industries Research Association, Jan. 27, 1948, pp. 11–16.

Eun Hee Cirlin et al., *Roughness and Anisotropy Effects on wettability of Polytetrafluoreothylene and Sodium–treated Polytetrafluoroethylene*, Journal of Polymer Science, 1973, vol. 11, pp. 785–799.

Pulp and Paper Research Institute of Canada, *Liquid Spreading: Edge Effect for Zero Contact Angle*, Journal of Colloid and Interface Science, Aug. 1978, vol. 66, No. 1, pp. 200–202.

Robert N. Wenzel, *Resistance of Solid Surfaces to Wetting by Water*, Industrial and Engineering Chemistry, Aug. 1936, vol. 28, No. 8, pp. 988–994.

Will H. Coghill et al., *Why Water Over–Fills a Tumbler*, Scientific American Supplement, Jul. 27, 1918, vol. 86, No. 2221, pp. 52–53.

R.D. Schulze et al., *Young's equilibrium contact angle on rough solid surfaces. Part I. An empirical determination*, J. Adhesion Sci. Technol., 1989, vol. 3, No. 1, pp. 39–48.

J.F. Oliver et al., *An Experimental Study of Some Effects of Solid Surface Roughness on Wetting*, Colloids and Surfaces, 1980, vol. 1, pp. 79–104.

Kiyoharu Tadanaga et al., *Superhydrophobic–Superhydrophilic Micropatterning on Flowerlike Alumina Coating Film by the Sol–Gel Method*, American Chemical Society, 2000, vol. 12, pp. 590–592.

S. Herminghaus, *Roughness–induces non–wetting*, Europhysics Letters, Oct. 15, 2000, vol. 52, pp. 165–170.

J. Bico et al., *Rough wetting*, Europhysics Letters, Jul. 15, 2001 vol. 55, pp. 214–220.

Randy Doyle Hazlett, *Fractal Applications: Wettability and Contact Angle*, Journal of Colloid and Interface Science, Jul. 1990, vol. 137, No. 2, 527–533.

Y. Tamai et al., *Experimental Study of the Relation between Contact Angle and Surface Roughness*, The Journal of Physical Chemistry, 1972, vol. 76, No. 22, pp. 3267–3271.

J. Kijlstra et al., *Roughness and topology of ultra–hydrophobic surfaces*, Colloids and Surfaces, 2002, vol. 206, pp. 521–529.

Satoshi Shibuichi et al., *Super Water–Repellent Surfaces Resulting from Fractal Structure*, J. Phys. Chem., 1996, vol. 100, pp. 19512–19517.

J. Bico et al., *Pearl drops*, Europhysics Letters, Jul. 15, 1999, vol. 47, No. 2, pp. 220–226.

H. Yildirim Erbil et al., *Transformation of a Simple Plastic into a Superhydrophobic Surface*, Science, Feb. 28, 2002, vol. 299, pp. 1377–1380.

J.D. Miller et al., *Effect of Roughness as Determined by Atomic Force Microscopy on the Wetting Properties of PTFE Thin Films\**, Polymer Engineering and Science, Jul. 1996, vol. 36, No. 14, pp. 1849–1855.

Atsushi Hozumi et al., *Preparation of ultra water–repellent films by microwave plasma–enchanced CVD*, Thin Solid Films, 1997, pp. 222–225.

Brian D. Reiss et al., *DNA–Directed Assembly of Anisotropic Nanopaticles on Lithographically Defined Surfaces and in Solution*, Materials Research Society, 2001, vol. 635, pp. C6.2.1–C6.2.6.

F.E. Bartell et al., *Surface Roughness as Related to Hysteresis of Contact Angles.[1] I. The System Paraffin–Water–Air*, J. Phys. Chem., Feb. 1953, vol. 57, pp. 211–215.

F.E. Bartell et al., *Surace Roughness as Related to Hysteresis of Contact Angles. II. The Systems Paraffin–3 Molar Calcium Chloride Solution–Air and Paraffin–Glycerol–Air[1]*. J. Phys. Chem., Apr. 1953, vol. 57, pp. 455–463.

D. Richard et al., *Bouncing water drops*, Europhysics letters, Jun. 15, 2000, vol. 50, pp. 769–775.

Jun Yang et al., *Microfluid Flow in Circular Microchannel with Electrokinetic Effect and Navier's Slip Condition*, Langmuir, 2003, vol. 19, No. 4, pp. 1047–1053.

Neelesh A. Patankar, *On the Modeling of Hydrophobic Contact Angles on Rough Surfaces*, Langmuir, 2003, vol. 19, No. 4, pp. 1249–1253.

Suguru Okuyama et al., *Periodic Submicrocylinder Diamond Surfaces Using Two–Dimensional Fine Particle Arrays*, Langmuir, 2002, vol. 18, No. 22, pp. 8282–8287.

Yoshihito Kunugi et al., *Electro–organic reactions on organic electrodes.*, J. Electroanal. Chem., 1993, vol. 353, pp. 209–215.

C. Huh[1] et al., *Effects of Surface Roughness on Wetting (Theoretical)*, Journal of Colloid and Interface Science, Jun. 1, 1977, vol. 60, No. 1, pp. 11–38.

Letter to the Editors, *Contact Angles by Scanning Electron Microscopy. Silicon Oil on Polished Aluminum*, Journal of Collid and Interface Science, Feb. 1971, vol. 35, No. 2, pp. 362–364.

Norman R. Morrow, *The Effects of Surface Roughness on Contact Angle with Special Reference ot Petroleum Recovery*, The Journal of Canadian Petroleum, Oct.–Dec. 1975, pp. 42–54.

Pascale Aussillous et al., *Liquid Marbles*, Nature, Jun. 21, 2001, vol. 411, pp. 924–896.

Wei Jin et al., *Wetting Hysteresis at the Molecular Scale*, Physical Review Letters, Feb. 24, 1997, vol. 78, No. 8, pp. 1520–1523.

H.J. Busscher et al., *The Effect of Surface Roughening of Polymers on Measured Contact Angles of Liquids*, Colloids and Surfaces, 1984, pp. 319–331.

R. Shuttleworth et al., *The Spreading of a Liquid Over a Rough Solid*, Feb. 23, 1948, pp. 16–22.

J.F. Oliver et al., *Resistance to Spreading of Liquids by Sharp Edges[1]*, Journal of Colloid and Interface Science, May 1977, vol. 59, No. 3, pp. 568–579.

T. Onda et al., *Super–Water–Repellent Fractal Surfaces*, The ACS Journal of Surfaces and Colloids, May 1, 1996, vol. 12, No. 9, pp. 2125–2127.

Phillip G. Wapner et al., *Partial Wetting Phenomena on Nonplanar Surfaces and in Shaped Microchannels*, Langmuir, 2002, vol. 18, No. 4, pp. 1225–1230.

Joonwon Kim et al., *Nanostructured Surfaces for Dramatic Reduction of Flow Resistance in Droplet–Based Microfluidics*, 2002, pp. 479–482.

\* cited by examiner

| Geometry | $\Lambda$ |
|---|---|
| Hexagonal array of square posts | $4x/y^2$ |
| Cubic array of square posts | $4x/y^2$ |
| Cubic array of circular posts | $\pi x/y^2$ |

ULTRAPHOBIC SURFACE FOR HIGH PRESSURE LIQUIDS

RELATED APPLICATIONS

This application claims the benefit of U.S. Provisional Patent Application Ser. No. 60/462,963, entitled "Ultraphobic Surface for High Pressure Liquids", filed Apr. 15, 2003, hereby fully incorporated herein by reference.

FIELD OF THE INVENTION

This invention relates generally to ultraphobic surfaces, and more specifically to ultraphobic surfaces that exhibit ultraphobic properties at liquid pressures over one atmosphere.

BACKGROUND OF THE INVENTION

Many industrial processes involve the interaction of liquids with solid surfaces. Often, it is desirable to control or influence the manner of the interaction, particularly the degree of wetting of the surface, so as to achieve a specific result. For example, surfactants are sometimes added to liquids used in cleaning processes so as to achieve greater surface wetting. In a converse example, liquid repellent coatings are sometimes added to clothing products to reduce surface wetting and accelerate drying of the clothing.

Efforts have been underway for decades to analyze and understand the principles and properties affecting surface wetting. There has been a particular interest in liquid "phobic" surfaces, which are surfaces that are resistant to wetting by liquids. Such surfaces may be referred to as hydrophobic where the liquid is water, and lyophobic relative to other liquids. If the surface resists wetting to an extent that a small droplet of water or other liquid exhibits a very high stationary contact angle with the surface (greater than about 120 degrees), if the surface exhibits a markedly reduced propensity to retain liquid droplets, or if a liquid-gas-solid interface exists at the surface when completely submerged in liquid, the surface may be generally referred to as an ultrahydrophobic or ultralyophobic surface. For the purposes of this application, the term ultraphobic is used to refer generally to both ultrahydrophobic and ultralyophobic surfaces.

Ultraphobic surfaces are of special interest in commercial and industrial applications for a number of reasons. In nearly any process where a liquid must be dried from a surface, significant efficiencies result if the surface sheds the liquid without heating or extensive drying time.

Moreover, friction between the liquid and the surface is dramatically lower for an ultraphobic surface as opposed to a conventional surface. As a result, ultraphobic surfaces are extremely desirable for reducing surface friction and increasing flow in a myriad of hydraulic and hydrodynamic applications on a macro scale, and especially in microfluidic applications.

It is now well known that surface roughness has a significant effect on the degree of surface wetting. It has been generally observed that, under some circumstances, roughness can cause liquid to adhere more strongly to the surface than to a corresponding smooth surface. Under other circumstances, however, roughness may cause the liquid to adhere less strongly to the rough surface than the smooth surface. In some circumstances, the surface may be ultraphobic.

Efforts have been made previously at introducing intentional roughness on a surface to produce an ultraphobic surface. The roughened surface generally takes the form of a substrate member with a multiplicity of microscale to nanoscale projections or cavities, referred to herein as "asperities".

Previous attempts at producing ultraphobic surfaces with micro/nanoscale asperities have been only partially successful. Generally, while the prior art surfaces have exhibited ultraphobic properties under some circumstances relative to liquid droplets carefully placed on the surface, the properties generally disappear when a droplet is impacted with the surface.

Moreover, fluid pressure in many industrial applications where ultraphobic surfaces are desirably used often exceeds one atmosphere, and in extreme applications, may reach hundreds of atmospheres. Ultraphobic surfaces produced to date appear to be effective as an ultraphobic surface only up to about 0.1 atmospheres.

Prior art ultraphobic surfaces are often formed with delicate polymer or chemical coatings deposited on the substrate. These coatings are easily physically damaged so as to be ineffective.

There is still a need in the industry for a durable ultraphobic surface that retains ultraphobic properties when impacted by liquid or under a column of liquid at pressure heads exceeding at least one atmosphere.

SUMMARY OF THE INVENTION

The invention is a durable ultraphobic surface that is capable of retaining ultraphobic properties at liquid pressures of one atmosphere and above. The surface generally includes a substrate portion with a multiplicity of projecting regularly shaped microscale or nanoscale asperities disposed so that the surface has a predetermined contact line density measured in meters of contact line per square meter of surface area equal to or greater than a contact line density value "$\Lambda_L$" determined according to the formula:

$$\Lambda_L = \frac{-10{,}330}{\gamma\cos(\theta_{a,0} + \omega - 90°)}$$

where $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

The asperities may be formed in or on the substrate material itself or in one or more layers of material disposed on the surface of the substrate. The asperities may be any regularly or irregularly shaped three dimensional solid or cavity and may be disposed in any regular geometric pattern or randomly.

The invention may also include a process for producing a surface having ultraphobic properties at liquid pressures up to a predetermined pressure value. The process includes steps of selecting an asperity rise angle; determining a critical contact line density "$\Lambda_L$" value according to the formula:

$$\Lambda_L = \frac{-P}{\gamma\cos(\theta_{a,0} + \omega - 90°)}$$

where P is the predetermined pressure value, $\gamma$ is the surface tension of the liquid, and $\theta_{a,0}$ is the experimentally measured true advancing contact angle of the liquid on the asperity material in degrees, and $\omega$ is the asperity rise angle; providing a substrate member; and forming a multiplicity of projecting asperities on the substrate so that the surface has an actual contact line density equal to or greater than the critical contact line density.

The asperities may be formed using photolithography, or using nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of parallel carbon nanotubes on the substrate. The process may further include the step of determining a critical asperity height value "$Z_c$" in meters according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the true advancing contact angle of the liquid on the surface in degrees, and $\omega$ is the asperity rise angle in degrees.

DETAILED DESCRIPTION OF THE INVENTION

Figure 1:
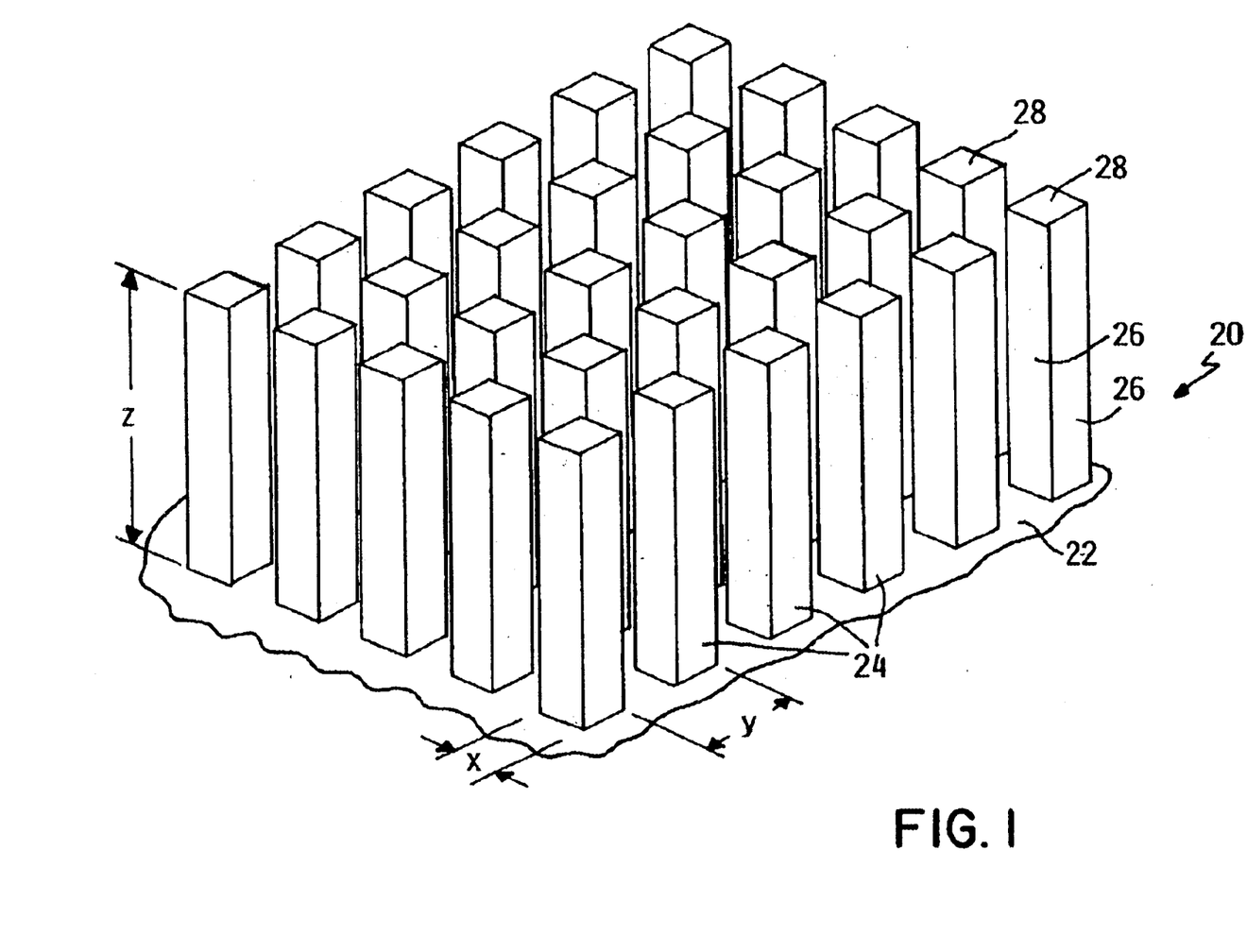
FIG. 1 is a perspective, enlarged view of an ultraphobic surface according to the present invention, wherein a multiplicity of nano/micro scale asperities are arranged in a rectangular array.

An enlarged view of an ultraphobic surface 20 according to the present invention is depicted in FIG. 1. The surface 20 generally includes a substrate 22 with a multiplicity of projecting asperities 24. Each asperity 24 has a plurality of sides 26 and a top 28. Each asperity 24 has a width dimension, annotated "x" in the figures, and a height dimension, annotated "z" in the figures.

Figure 2:
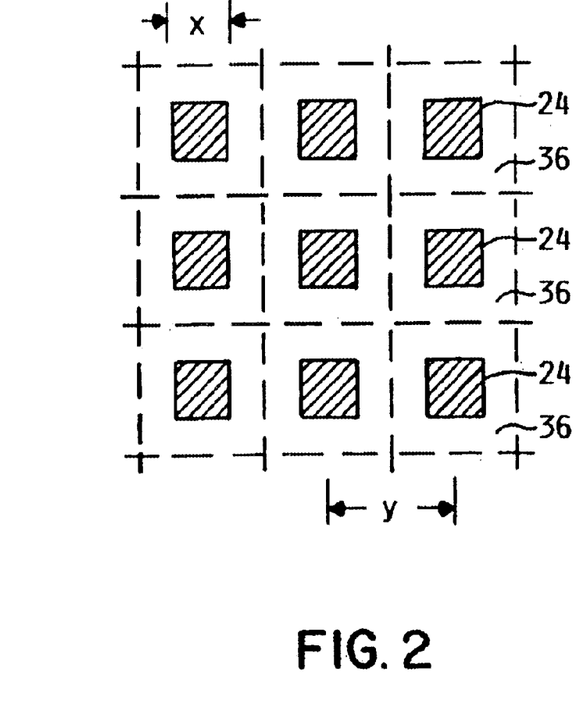
FIG. 2 is a top plan view of a portion of the surface of FIG. 1.
Figure 3:
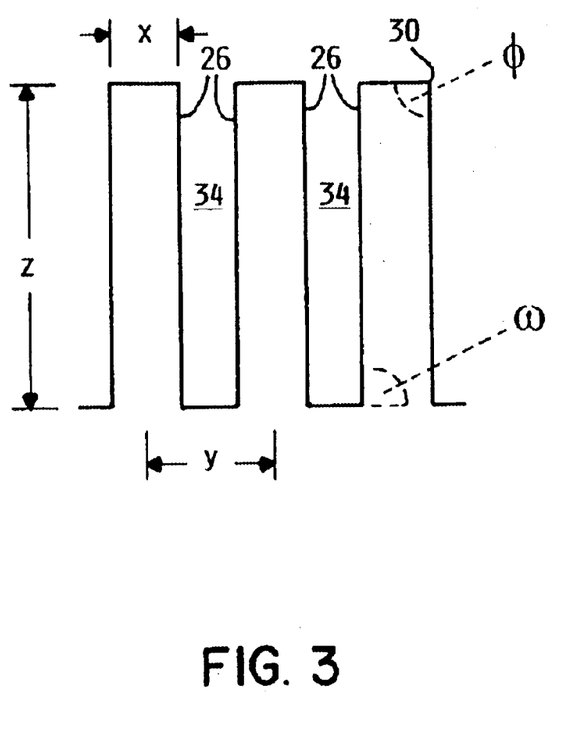
FIG. 3 is a side elevation view of the surface portion depicted in FIG. 2.

As depicted in FIGS. 1–3, asperities 24 are disposed in a regular rectangular array, each asperity spaced apart from the adjacent asperities by a spacing dimension, annotated "y" in the figures. The angle subtended by the top edge 30 of the asperities 24 is annotated $\phi$, and the rise angle of the side 26 of the asperities 24 relative to the substrate 22 is annotated $\omega$. The sum of the angles $\phi$ and $\omega$ is 180 degrees.

Figure 7:
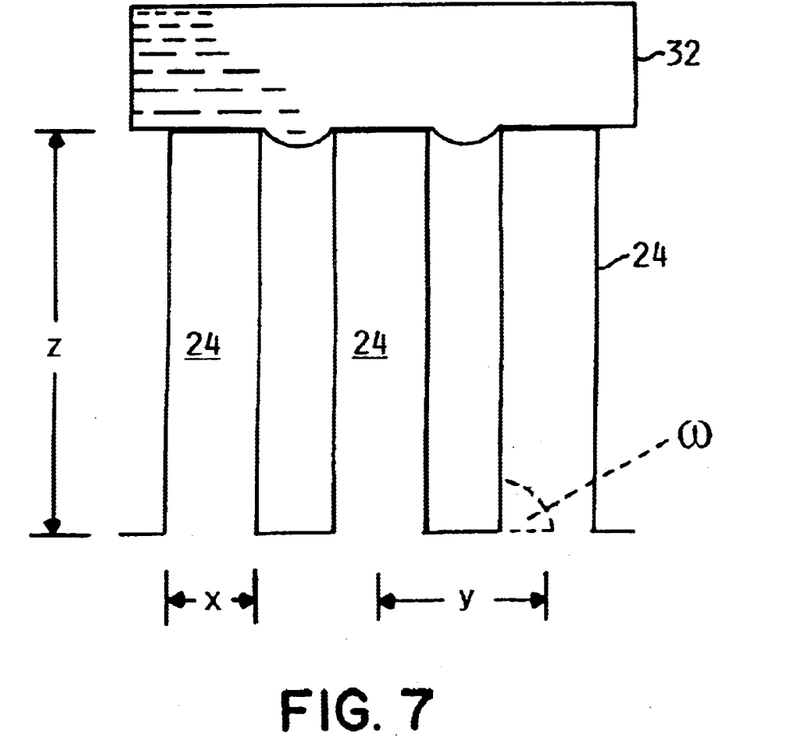
FIG. 7 is a side elevation view depicting a quantity of liquid suspended atop asperities.
Figure 8:
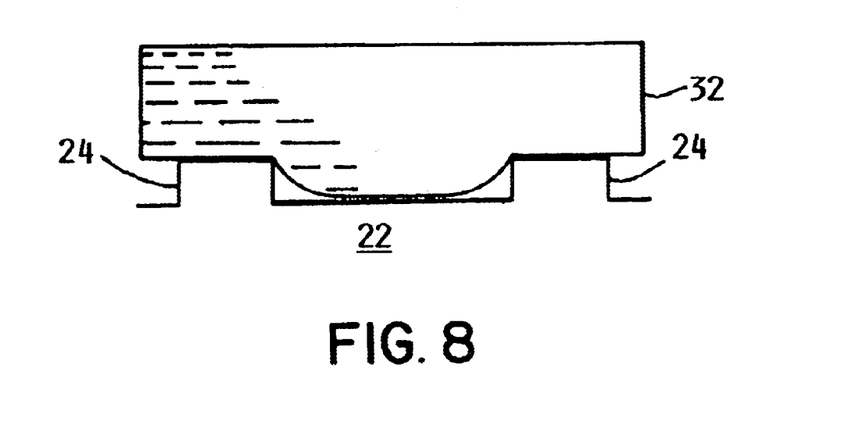
FIG. 8 is a side elevation view depicting the liquid contacting the bottom of the space between asperities.

Generally, surface 20 will exhibit ultraphobic properties when a liquid-solid-gas interface is maintained at the surface. As depicted in FIG. 7, if liquid 32 contacts only the tops 28 and a portion of the sides 26 proximate top edge 30 of asperities 24, leaving a space 34 between the asperities filled with air or other gas, the requisite liquid-solid-gas interface is present. The liquid may be said to be "suspended" atop and between the top edges 30 of the asperities 24.

As will be disclosed hereinbelow, the formation of the liquid-solid-gas interface depends on certain interrelated geometrical parameters of the asperities 24, the properties of the liquid, and the interaction of the liquid with the solid surface. According to the present invention, the geometrical properties of asperities 24 may be selected so that the surface 20 exhibits ultraphobic properties at any desired liquid pressure.

Referring to the rectangular array of FIGS. 1–3, surface 20 may be divided into uniform areas 36, depicted bounded by dashed lines, surrounding each asperity 24. The area density of asperities ($\delta$) in each uniform area 36 may be described by the equation:

$$\delta = \frac{1}{y^2}, \tag{1}$$

where y is the spacing between asperities measured in meters.

For asperities 24 with a square cross-section as depicted in FIGS. 1–3, the length of perimeter (p) of top 28 at top edge 30:

$$p = 4x, \tag{2}$$

where x is the asperity width in meters.

Perimeter p may be referred to as a "contact line" defining the location of the liquid-solid-gas interface. The contact line density ($\Lambda$) of the surface, which is the length of contact line per unit area of the surface, is the product of the perimeter (p) and the area density of asperities ($\delta$) so that:

$$\Lambda = p\delta. \tag{3}$$

For the rectangular array of square asperities depicted in FIGS. 1–3:

$$\Lambda = 4x/y^2. \tag{4}$$

A quantity of liquid will be suspended atop asperities 24 if the body forces (F) due to gravity acting on the liquid are less than surface forces (f) acting at the contact line with the asperities. Body forces (F) associated with gravity may be determined according to the following formula:

$$F = \rho g h, \tag{5}$$

where (p) is the density of the liquid, (g) is the acceleration due to gravity, and (h) is the depth of the liquid. Thus, for example, for a 10 meter column of water having an approximate density of 1000 kg/M$^3$, the body forces (F) would be:

$$F=(1000 \text{ kg/m}^3)(9.8 \text{ m/s}^2)(10 \text{ m}) = 9.8 \times 10^4 \text{ kg/m}^2\text{-s}.$$

On the other hand, the surface forces (f) depend on the surface tension of the liquid ($\gamma$), its apparent contact angle with the side 26 of the asperities 24 with respect to the vertical $\theta_s$, the contact line density of the asperities ($\Lambda$) and the apparent contact area of the liquid (A):

$$f = -\Lambda A \gamma \cos \theta_s. \tag{6}$$

The true advancing contact angle ($\theta_{a,0}$) of a liquid on a given solid material is defined as the largest experimentally measured stationary contact angle of the liquid on a surface of the material having essentially no asperities. The true advancing contact angle is readily measurable by techniques well known in the art.

Suspended drops on a surface with asperities exhibit their true advancing contact angle value ($\theta_{a,0}$) at the sides of the asperities. The contact angle with respect to the vertical at the side of the asperities ($\theta_s$) is related to the true advancing contact angle ($\theta_{a,0}$) by $\phi$ or $\omega$ as follows:

$$\theta_s = \theta_{a,0} + 90° - \omega = \theta_{a,0} + \omega - 90°. \tag{7}$$

By equating F and f and solving for contact line density $\Lambda$, a critical contact line density parameter $\Lambda_L$ may be determined for predicting ultraphobic properties in a surface:

$$\Lambda_L = \frac{-\rho g h}{\gamma \cos(\theta_{a,0} + \omega - 90°)}, \tag{8}$$

where (p) is the density of the liquid, (g) is the acceleration due to gravity, (h) is the depth of the liquid, ($\gamma$) is the surface tension of the liquid, $\omega$ is the rise angle of the side of the asperities relative to the substrate in degrees, and ($\theta_{a,0}$) is the experimentally measured true advancing contact angle of the liquid on the asperity material in degrees.

If $\Lambda > \Lambda_L$, the liquid will be suspended atop the asperities 24, producing an ultraphobic surface. Otherwise, if $\Lambda < \Lambda_L$, the liquid will collapse over the asperities and the contact interface at the surface will be solely liquid/solid, without ultraphobic properties.

It will be appreciated that by substituting an appropriate value in the numerator of the equation given above, a value of critical contact line density may be determined to design a surface that will retain ultraphobic properties at any desired amount of pressure. The equation may be generalized as:

$$\Lambda_L = \frac{-P}{\gamma \cos(\theta_{a,0} + \omega - 90°)}, \tag{9}$$

where P is the maximum pressure under which the surface must exhibit ultraphobic properties in kilograms per square meter, $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

It is generally anticipated that a surface 20 formed according to the above relations will exhibit ultraphobic properties under any liquid pressure values up to and including the value of P used in equation (9) above. The ultraphobic properties will be exhibited whether the surface is submerged, subjected to a jet or spray of liquid, or impacted with individual droplets.

According to the above relations, surface 20 will exhibit ultraphobic properties at a liquid pressure of one atmosphere, equal to about 10,330 kg/m$^2$, where the contact line density $\Lambda$ of surface 20 equals or exceeds a critical contact line density $\Lambda_L$ determined as follows:

$$\Lambda_L = \frac{-10,330}{\gamma \cos(\theta_{a,0} + \omega - 90°)}, \tag{10}$$

where $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

Once the value of critical contact line density is determined, the remaining details of the geometry of the asperities may be determined according to the relationship of x and y given in the equation for contact line density. In other words, the geometry of the surface may be determined by choosing the value of either x or y in the contact line equation and solving for the other variable.

Figure 6:
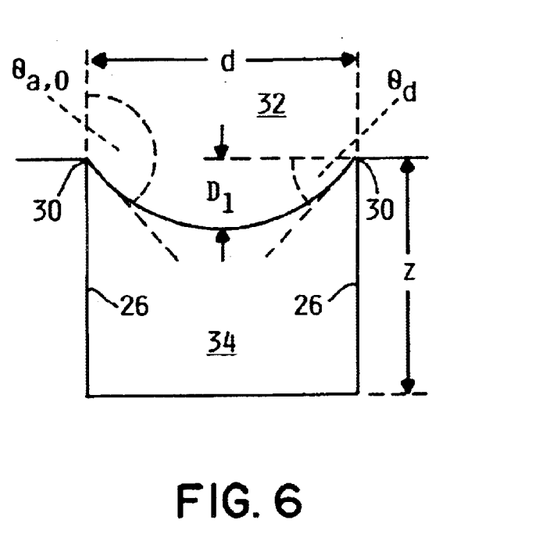
FIG. 6 is a side elevation view depicting the deflection of liquid suspended between asperities.

The liquid interface deflects downwardly between adjacent asperities by an amount $D_1$ as depicted in FIG. 6. If the amount $D_1$ is greater than the height (z) of the asperities 24, the liquid will contact the substrate 22 at a point between the asperities 24. If this occurs, the liquid will be drawn into space 34, and collapse over the asperities, destroying the ultraphobic character of the surface. The value of $D_1$ represents a critical asperity height ($Z_c$), and is determinable according to the following formula:

$$D_1 = Z_c = \frac{d(1 - \cos(\theta_{a,0} + \omega - 180°))}{2\sin(\theta_{a,0} + \omega' - 180°)}, \tag{11}$$

where (d) is the distance between adjacent asperities, $\omega$ is the asperity rise angle, and $\theta_{a,0}$ is the experimentally measured true advancing contact angle of the liquid on the asperity material. The height (z) of asperities 24 must be at least equal to, and is preferably greater than, critical asperity height ($Z_c$).

Figure 9:
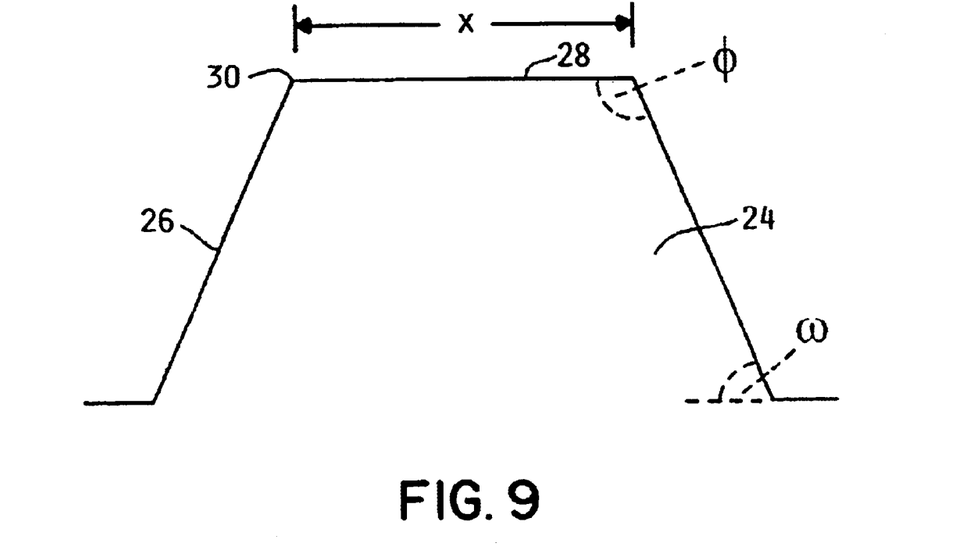
FIG. 9 is a side elevation view of a single asperity in an alternative embodiment of the invention wherein the asperity rise angle is an acute angle.
Figure 10:
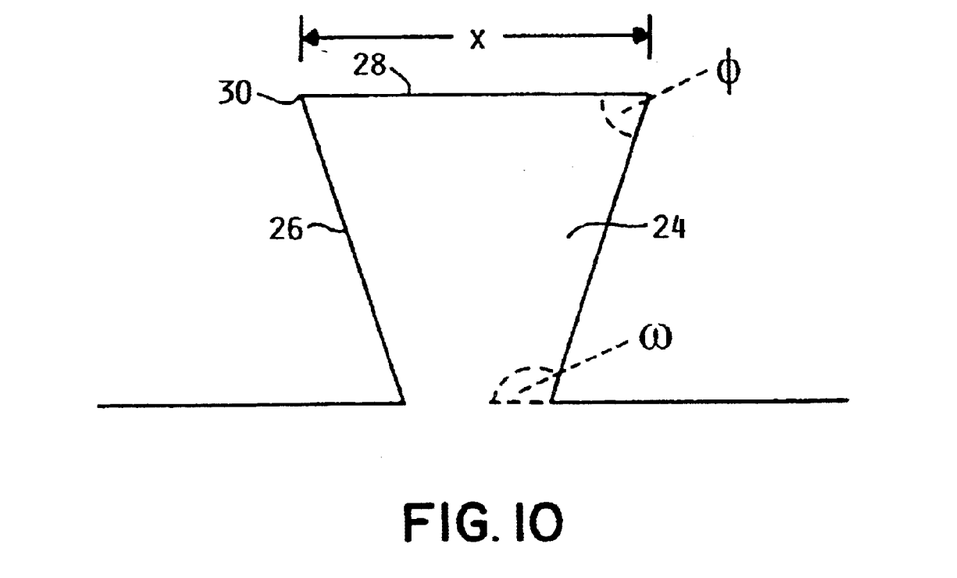
FIG. 10 is a side elevation view of a single asperity in an alternative embodiment of the invention wherein the asperity rise angle is an obtuse angle.

Although in FIGS. 1–3 the asperity rise angle $\omega$ is 90 degrees, other asperity geometries are possible. For example, $\omega$ may be an acute angle as depicted in FIG. 9 or an obtuse angle as depicted in FIG. 10. Generally, it is preferred that $\omega$ be between 80 and 130 degrees.

Figure 11:
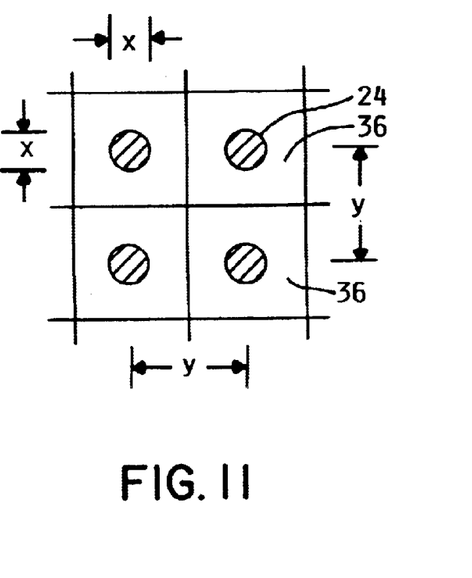
FIG. 11 a partial top plan view of an alternative embodiment of the present invention wherein the asperities are cylindrical and are arranged in a rectangular array.
Figure 12:
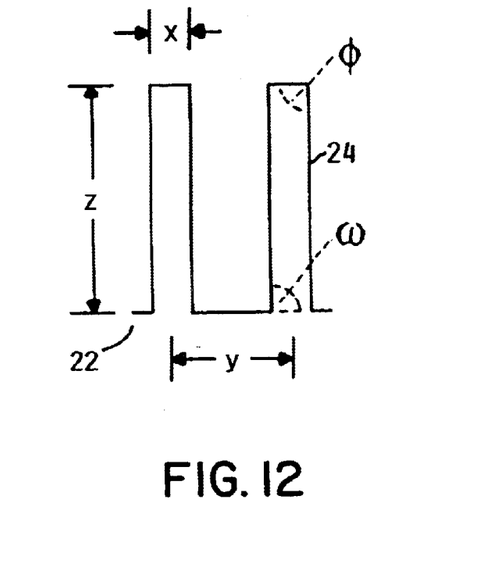
FIG. 12 is a side elevation view of the alternative embodiment of FIG. 11.
Figure 14:
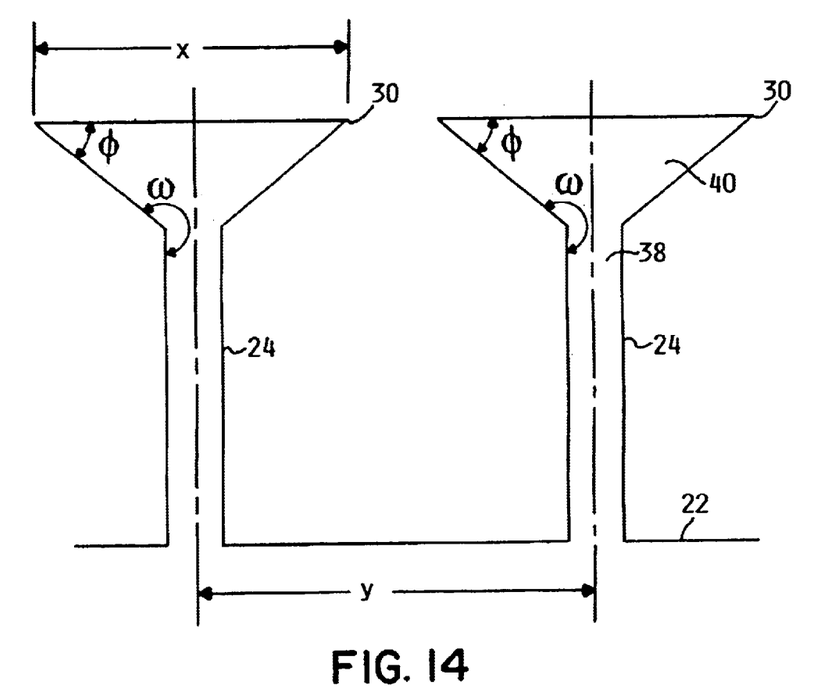
FIG. 14 is a side elevation view of an alternative embodiment of the present invention.
Figure 15:
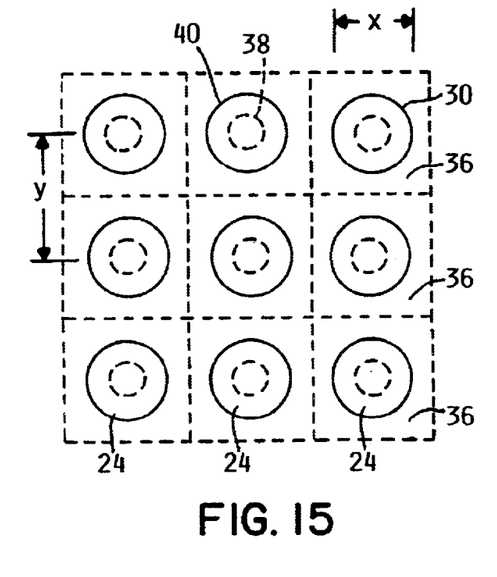
FIG. 15 is a top plan view of the alternative embodiment of FIG. 14.
Figure 16:
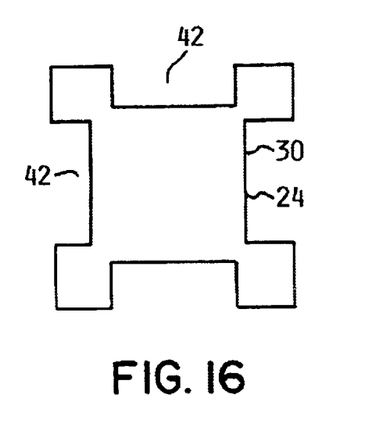
FIG. 16 is a top plan view of a single asperity in an alternative embodiment of the present invention.

It will also be appreciated that a wide variety of asperity shapes and arrangements are possible within the scope of the present invention. For example, asperities may be polyhedral, cylindrical as depicted in FIGS. 11–12, cylindroid, or any other suitable three dimensional shape. In addition, various strategies may be utilized to maximize contact line density of the asperities. As depicted in FIGS. 14 and 15, the asperities 24 may be formed with a base portion 38 and a head portion 40. The larger perimeter of head portion 40 at top edge 30 increases the contact line density of the surface. Also, features such as recesses 42 may be formed in the asperities 24 as depicted in FIG. 16 to increase the perimeter at top edge 30, thereby increasing contact line density. The asperities may also be cavities formed in the substrate.

Further information and discussion regarding the development of the relations given above and the optimization of ultraphobic surfaces is provided in Appendices 1–9 of this application. Appendices 1–9 are to be considered a part of this specification.

Figure 4:
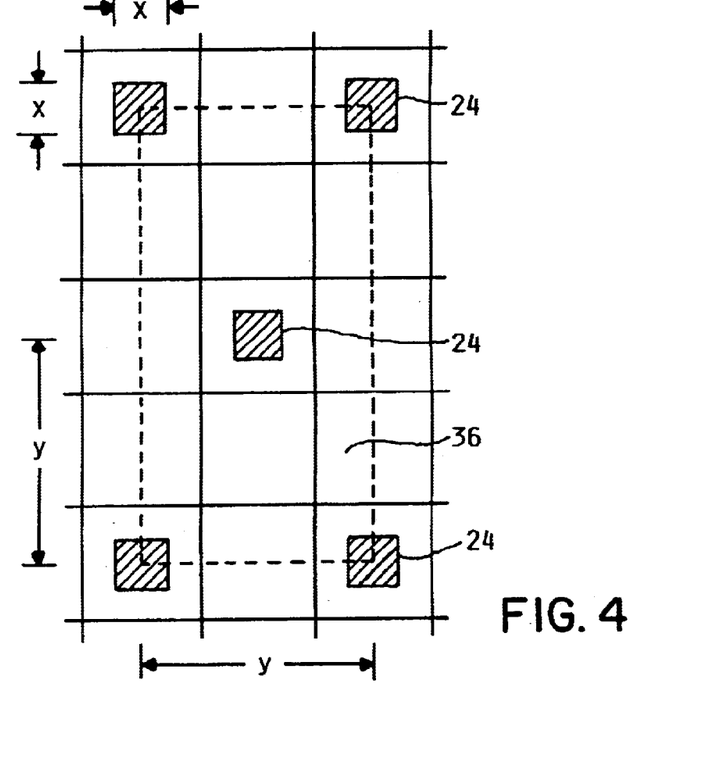
FIG. 4 is a partial top plan view of an alternative embodiment of the present invention wherein the asperities are arranged in a hexagonal array.
Figure 5:
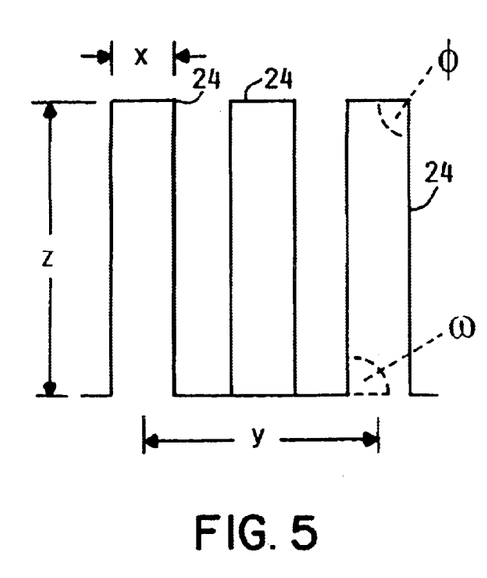
FIG. 5 is a side elevation view of the alternative embodiment of FIG. 4.
Figure 13:
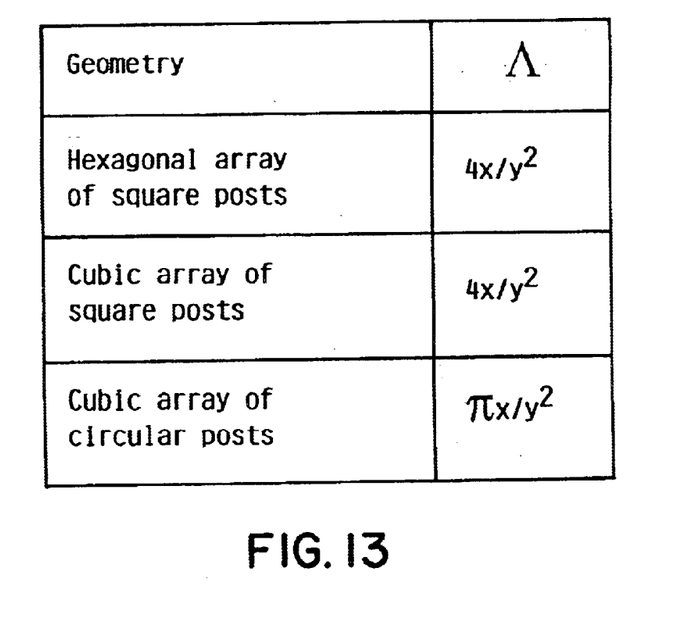
FIG. 13 is a table listing formulas for contact line density for a variety of asperity shapes and arrangements.

The asperities may be arranged in a rectangular array as discussed above, in a polygonal array such as the hexagonal array depicted in FIGS. 4–5, or a circular or ovoid arrangement. The asperities may also be randomly distributed so long as the critical contact line density is maintained, although such a random arrangement may have less predictable ultraphobic properties, and is therefore less preferred. In such a random arrangement of asperities, the critical contact line density and other relevant parameters may be conceptualized as averages for the surface. In the table of FIG. 13, formulas for calculating contact line densities for various other asperity shapes and arrangements are listed.

Generally, the substrate material may be any material upon which micro or nano scale asperities may be suitably formed. The asperities may be formed directly in the substrate material itself, or in one or more layers of other material deposited on the substrate material, by photolithography or any of a variety of suitable methods. A photolithography method that may be suitable for forming micro/nanoscale asperities is disclosed in PCT Patent Application Publication WO 02/084340, hereby fully incorporated herein by reference.

Other methods that may be suitable for forming asperities of the desired shape and spacing include nanomachining as disclosed in U.S. Patent Application Publication No. 2002/00334879, microstamping as disclosed in U.S. Pat. No. 5,725,788, microcontact printing as disclosed in U.S. Pat. No. 5,900,160, self-assembled metal colloid monolayers, as disclosed in U.S. Pat. No. 5,609,907, microstamping as disclosed in U.S. Pat. No. 6,444,254, atomic force microscopy nanomachining as disclosed in U.S. Pat. No. 5,252,835, nanomachining as disclosed in U.S. Pat. No. 6,403,388, sol-gel molding as disclosed in U.S. Pat. No. 6,530,554, self-assembled monolayer directed patterning of surfaces, as disclosed in U.S. Pat. No. 6,518,168, chemical etching as disclosed in U.S. Pat. No. 6,541,389, or sol-gel stamping as disclosed in U.S. Patent Application Publication No. 2003/0047822, all of which are hereby fully incorporated herein by reference. Carbon nanotube structures may also be usable to form the desired asperity geometrics. Examples of carbon nanotube structures are disclosed in U.S. Patent Application Publication Nos. 2002/0098135 and 2002/0136683, also hereby fully incorporated herein by reference. Also, suitable asperity structures may be formed using known methods of printing with colloidal inks. Of course, it will be appreciated that any other method by which micro/nanoscale asperities may be accurately formed may also be used.

It is anticipated that the ultraphobic surface of the present invention will be useful in myriad applications. For example, it is anticipated that if ultraphobic surfaces are applied on the wetted portions of fluid handling systems such as piping, tubing, fittings, valves and other devices, significant reduction in fluid friction and turbulance may be achieved. Similarly, flow impedance in mircofluidic devices may be reduced by a reduction in viscous and surface forces resulting from ultraphobic wetted surfaces. Effectiveness of critical cleaning processes may be improved by faster drying times and less chemical carryover residue remaining on the surface after drying. It is also anticipated that ultraphobic surfaces according to the present invention will be resistant to the growth of organisms in a bio-film on the surface, due in part to the greatly improved drainability of the surface. Further, due to the liquid-solid-gas interface at the surface, it is anticipated that the ultraphobic surface of the present invention may be applied to a gas transfer membrane to improve the effectiveness of gas transfer in and out of a liquid.

EXAMPLE

A surface is desired that will exhibit ultraphobic characteristics under water pressures of up to 10 atmospheres. The desired surface geometry is a rectangular array of elongate polyhedrons having a generally square cross-section and an asperity rise angle of 90 degrees. The asperities are to be formed, using photolithography, in a silicon substrate, which will be treated with organosilanes after the asperities are formed. The experimentally measured true advancing contact angle of water on an organosilane treated silicon substrate without asperities is approximately 110 degrees. The surface tension of pure water is approximately 0.073 Newtons per square meter. The critical contact line density for such a surface may be determined as follows:

$$\Lambda_L = \frac{-103{,}300}{\gamma \cos(\theta_{a,0} + \omega - 90°)} = \frac{-103{,}300}{0.073 \cos(110° + 90° - 90°)} = 4.1 \times 10^6 \, \text{m/m}^2$$

Selecting an asperity width of 20 nm, the contact line equation for a rectangular array of square polyhedrons may be used to solve for the required asperity spacing:

$$y = \sqrt{\frac{4x}{\Lambda}} = \sqrt{\frac{4(2 \times 10^{-8})}{4.1 \times 10^6}} = 139 \, \text{nm}$$

The critical asperity height ($Z_c$) is determined as:

$$Z_c = \frac{d(1 - \cos(\theta_{a,0} + \omega - 180°))}{2\sin(\theta_{a,0} + \omega - 108°)} =$$

$$\frac{(.000000139 - .00000002)\cos(110° + 90° - 180°)}{2\sin(110° + 90° - 180°)} = 163 \, \text{nm}$$

Thus, in one configuration, the surface will comprise a rectangular array of projecting elongate polyhedrons having a generally square cross section, wherein the polyhedrons are 20 nm in width and spaced no more than about 139 nm apart. The polyhedrons should be more than 163 nm in height.

Of course, a different surface geometry results if the selected asperity width is 50 nm:

$$y = \sqrt{\frac{4x}{\Lambda}} = \sqrt{\frac{4(5 \times 10^{-8})}{4.1 \times 10^6}} = 220 \, \text{nm}$$

and:

$$Z_c = \frac{(.000000220 - .00000005)\cos(110° + 90° - 180°)}{2\sin(110° + 90° - 180°)} = 234 \, \text{nm}$$

In this configuration, the surface will comprise a rectangular array of projecting elongate polyhedrons having a generally square cross section, wherein the polyhedrons are 50 nm in width and spaced no more than about 220 nm apart. The polyhedrons should be more than 234 nm in height.

What is claimed is:

1. An ultraphobic surface comprising:
   a substrate having a surface with a multiplicity of substantially uniformly shaped asperities thereon, each asperity having a common asperity rise angle relative to the substrate, the asperities positioned so that the surface has a contact line density measured in meters of contact line per square meter of surface area equal to or greater than a contact line density value "$\Lambda_L$" determined according to the formula:

$$\Lambda_L = \frac{-10,330}{\gamma \cos(\theta_{a,0} + \omega - 90°)}$$

where $\gamma$ is the surface tension of a liquid in contact with the surface in Newtons per meter, $\theta_{a,0}$ is the experimentally measured true advancing contact angle of the liquid on the asperity material in degrees, and $\omega$ is the asperity rise angle in degrees, wherein the surface exhibits a liquid-solid-gas interface with the liquid at a pressure of at least one atmosphere.

2. The surface of claim 1, wherein the asperities are projections.

3. The surface of claim 2, wherein the asperities are polyhedrally shaped.

4. The surface of claim 2, wherein each asperity has a generally square transverse cross-section.

5. The surface of claim 2, wherein the asperities are cylindrical or cylindroidally shaped.

6. The surface of claim 1, wherein the asperities are cavities formed in the substrate.

7. The surface of claim 1, wherein the asperities are positioned in a substantially uniform array.

8. The surface of claim 7, wherein the asperities are positioned in a rectangular array.

9. The surface of claim 1, wherein the asperities have a substantially uniform asperity height relative to the substrate portion, and wherein the asperity height is greater than a critical asperity height value "$Z_c$" in meters determined according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the experimentally measured true advancing contact angle of the liquid on the asperity material in degrees, and $\omega$ is the asperity rise angle in degrees.

10. A process of making an ultraphobic surface adapted for repelling a liquid at a pressure of at least one atmosphere in contact with the surface, the process comprising:

providing a substrate having an outer surface; and forming a multiplicity of substantially uniformly shaped asperities on the outer surface of the substrate, each asperity having a common asperity rise angle relative to the substrate portion, the asperities positioned so that the surface has a contact line density measured in meters of contact line per square meter of surface area equal to or greater than a contact line density value "$\Lambda_L$" determined according to the formula:

$$\Lambda_L = \frac{-10,330}{\gamma \cos(\theta_{a,0} + \omega - 90°)}$$

where $\gamma$ is the surface tension of the liquid in Newtons per meter, is the experimentally measured true advancing contact angle of the liquid on the asperity material in degrees, and $\omega$ is the asperity rise angle in degrees.

11. The process of claim 10, wherein the asperities are formed by photolithography.

12. The process of claim 10, wherein the asperities are formed by a process selected from the group consisting of nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, and disposing a layer of carbon nanotubes on the substrate.

13. A process for producing a surface having ultraphobic properties at liquid pressures up to a predetermined pressure value, the process comprising:

selecting an asperity rise angle;

determining a critical contact line density "$\Lambda_L$" value according to the formula:

$$\Lambda_L = \frac{-P}{\gamma \cos(\theta_{a,0} + \omega - 90°)}$$

where P is the predetermined pressure value, $\gamma$ is the surface tension of the liquid, $\theta_{a,0}$ is the experimentally measured true advancing contact angle of the liquid on the asperity material in degrees, and $\omega$ is the asperity rise angle;

providing a substrate member; and forming a multiplicity of projecting asperities on the substrate so that the surface has an actual contact line density equal to or greater than the critical contact line density.

14. The process of claim 13, wherein the asperities are formed using photolithography.

15. The process of claim 13, wherein the asperities are formed using wherein the asperities are formed using nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of carbon nanotubes on the substrate.

16. The process of claim 13, further comprising the step of selecting a geometrical shape for the asperities.

17. The process of claim 13, further comprising the step of selecting an array pattern for the asperities.

18. The process of claim 13, further comprising the steps of selecting at least one dimension for the asperities and determining at least one other dimension for the asperities using an equation for contact line density.

19. The process of claim 13, further comprising the step of determining a critical asperity height value "$Z_c$" in meters according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the true advancing contact angle of the liquid on the surface in degrees, and $\omega$ is the asperity rise angle in degrees.

* * * * *